US012557553B2

(12) United States Patent
Charles-Alfred

(10) Patent No.: US 12,557,553 B2
(45) Date of Patent: Feb. 17, 2026

(54) DETACHMENT CHAMBER FOR DETACHING A PIEZOELECTRIC LAYER FROM A DONOR SUBSTRATE

(71) Applicant: Soitec, Bernin (FR)

(72) Inventor: Cédric Charles-Alfred, Grenoble (FR)

(73) Assignee: Soitec, Bernin (FR)

( * ) Notice: Subject to any disclaimer, the term of this patent is extended or adjusted under 35 U.S.C. 154(b) by 162 days.

(21) Appl. No.: 18/353,980

(22) Filed: Jul. 18, 2023

(65) Prior Publication Data

US 2023/0363279 A1 Nov. 9, 2023

Related U.S. Application Data

(62) Division of application No. 16/322,777, filed as application No. PCT/EP2017/069470 on Aug. 1, 2017, now Pat. No. 11,744,154.

(30) Foreign Application Priority Data

Aug. 2, 2016 (FR) ...................................... 1657494

(51) Int. Cl.
*H10N 30/08* (2023.01)
*H10N 30/04* (2023.01)
(Continued)

(52) U.S. Cl.
CPC .......... *H10N 30/08* (2023.02); *H10N 30/072* (2023.02); *H10N 30/853* (2023.02);
(Continued)

(58) Field of Classification Search
CPC ...... H10N 30/08; H10N 30/085; Y10T 29/42; Y10T 29/49073; Y10T 29/53274;
(Continued)

(56) References Cited

U.S. PATENT DOCUMENTS 5,737,178 A 4/1998 Herchen
7,863,154 B2 1/2011 Yamazaki et al.
(Continued)

FOREIGN PATENT DOCUMENTS

CN 1632911 A 6/2005
CN 101620983 A 5/2011
(Continued)

OTHER PUBLICATIONS

Yatsuzuka et al, "Electrostatic chuck with a thin ceramic insulation layer for wafer holding," Conference Record of the 2001 IEEE Industry Applications Conference. 36th IAS Annual Meeting (Cat. No. 01CH37248), Chicago, IL, USA, 2001, pp. 399-403 vol. 1. (Year: 2001).*

(Continued)

*Primary Examiner* — A. Dexter Tugbang
(74) *Attorney, Agent, or Firm* — TraskBritt

(57) ABSTRACT

A detachment chamber for detaching a piezoelectric layer from a piezoelectric donor substrate includes at least one chuck having at least one electrode configured to apply an electric field to the piezoelectric donor substrate to detach the piezoelectric layer from the piezoelectric donor substrate.

19 Claims, 2 Drawing Sheets

(51) Int. Cl.
  *H10N 30/072* (2023.01)
  *H10N 30/853* (2023.01)
  *H10N 30/085* (2023.01)

(52) U.S. Cl.
  CPC .................. *H10N 30/8554* (2023.02); *H01L 2221/68363* (2013.01); *H10N 30/04* (2023.02); *H10N 30/085* (2023.02); *H10N 30/8542* (2023.02); *Y10T 29/42* (2015.01); *Y10T 29/53274* (2015.01)

(58) Field of Classification Search
  CPC ............ H01L 21/6831; H01L 21/6833; H01L 2221/68363
  See application file for complete search history.

(56) References Cited

U.S. PATENT DOCUMENTS

| | | | |
|---|---|---|---|
| 2002/0098713 | A1 | 7/2002 | Henley et al. |
| 2002/0135967 | A1 | 9/2002 | Fuwa et al. |
| 2010/0088868 | A1 | 4/2010 | Kando et al. |
| 2010/0108248 | A1 | 5/2010 | Hayakawa et al. |
| 2010/0180945 | A1 | 7/2010 | Henley et al. |
| 2011/0000060 | A1* | 1/2011 | Lee .................... Y10T 29/42 29/25.35 |
| 2011/0220275 | A1* | 9/2011 | Hayakawa ............ Y10T 29/42 156/247 |
| 2012/0118510 | A1* | 5/2012 | Banda ................ H01L 21/6831 156/704 |
| 2012/0141661 | A1* | 6/2012 | Cho .................... H01L 21/6831 361/234 |
| 2014/0288726 | A1* | 9/2014 | Miura ................ H01L 21/6831 700/299 |
| 2015/0328875 | A1 | 11/2015 | Hattori et al. |

FOREIGN PATENT DOCUMENTS

| | | | | |
|---|---|---|---|---|
| CN | 102569640 | B | 11/2014 | |
| CN | 105493247 | A | 4/2016 | |
| FR | 2914492 | A1 | 10/2008 | |
| JP | 2001-511608 | A | 8/2001 | |
| JP | 2009294638 | A * | 12/2009 | ......... B32B 37/0046 |
| JP | 2010-109909 | A | 5/2010 | |
| JP | 2011-015178 | A | 1/2011 | |
| JP | 2012-213244 | A | 11/2012 | |
| JP | 2015-529978 | A | 10/2015 | |
| KR | 10-2010-0024952 | A | 3/2010 | |
| KR | 10-2012-0025633 | A | 3/2012 | |
| KR | 10-2016-0069195 | A | 6/2016 | |
| TW | 200518203 | A | 1/2005 | |
| WO | 2018/024743 | A1 | 2/2018 | |

OTHER PUBLICATIONS

Chinese First Notification of Office Action for Application No. 201780048417.7 dated Mar. 24, 2022, 13 pages.
European Extended Search Report and Opinion for European Application No. 20180045.5, dated Sep. 3, 2020, 5 pages.
French Search Report for French Application No. FR2016057494, dated Jun. 16, 2017, 2 pages.
International Search Report for International Application No. PCT/EP2017/069470, mailed Dec. 13, 2017, 3 pages.
International Written Opinion for International Application No. PCT/EP2017/069470, mailed Dec. 13, 2017, 5 pages.
Japanese Decision to Grant a Patent for Japanese Application No. 2019-504705, dated Aug. 26, 2020, 5 pages with English translation.
Japanese Notice of Reasons for Refusal for Japanese Application No. 2019-504705, dated Mar. 24, 2020, 8 pages with English translation.
Japanese Notice of Reasons for Rejection for Japanese Application No. 2019-504705, dated Mar. 31, 2020, 4 pages with English translation.
Korean Grant of Patent for Korean Application No. 10-2019-7005237, dated Dec. 18, 2020, 4 pages with English translation.
Korean Notification of Reason for Refusal for Korean Application No. 10-2019-7005237, dated Jun. 5, 2020, 11 pages with English translation.
Machine Language Translation of CN 1632911, Aug. 2022. (Year: 2022).

* cited by examiner

DETACHMENT CHAMBER FOR DETACHING A PIEZOELECTRIC LAYER FROM A DONOR SUBSTRATE

CROSS-REFERENCE TO RELATED APPLICATIONS

This application is a divisional of U.S. patent application Ser. No. 16/322,777, filed Feb. 1, 2019, now U.S. Pat. No. 11,744,154, issued Aug. 29, 2023, which is a national phase entry under 35 U.S.C. § 371 of International Patent Application PCT/EP2017/069470, filed Aug. 1, 2017, designating the United States of America and published in English as International Patent Publication WO 2018/024743 A1 on Feb. 8, 2018, which claims the benefit under Article 8 of the Patent Cooperation Treaty to French Patent Application Serial No. 1657494, filed Aug. 2, 2016, the disclosure of each of which is hereby incorporated herein in its entirety by this reference.

TECHNICAL FIELD

The disclosure relates to a method for transferring a piezoelectric layer onto a support substrate and to a detachment chamber for carrying out at least a part of the method.

BACKGROUND

There is rising interest in assembly structures comprising a support substrate, like silicon or sapphire, with a thin piezoelectric layer attached thereto. It has been proposed to use a SMART CUT®-type process, known from silicon-on-insulator substrates, to obtain such an assembly structure.

The process could make use of a piezoelectric donor substrate with a predetermined splitting area inside the donor substrate. The predetermined splitting area can be obtained by implanting ions into the donor substrate. The donor substrate is subsequently attached to the support substrate and undergoes a thermal treatment to strengthen the bond between the donor and the support substrate and to detach the remainder of the donor substrate at the predetermined splitting area to thereby transfer a layer of the piezoelectric donor substrate onto the support substrate.

Under the effect of the higher temperature during the thermal treatment, the defects created in the predetermined splitting area by the implanted ions grow, which leads to local strain, which, at a given thermal budget, leads to the detachment and thereby to the transfer of a layer onto the support substrate.

In case of a piezoelectric donor substrate, it is, however, difficult to transfer the layer without breakage. This is due to the large difference in thermal expansion coefficients between the piezoelectric donor substrate and the support substrate (CTE mismatch). Thus, strain develops during the heat treatment at the interface of the donor and support substrate, which suddenly relaxes at the moment of detachment and leads to the breakage of the transferred layer.

BRIEF SUMMARY

The method disclosed herein provides an alternative layer transferring method that may reduce breakage of the transferred piezoelectric layer due to CTE mismatch.

In some embodiments, the present disclosure includes a method of transferring a piezoelectric layer onto a support substrate that comprises the steps of: a) providing a predetermined splitting area in a piezoelectric donor substrate, b) attaching the piezoelectric donor substrate to a support substrate to form an assembly, and c) detaching the piezoelectric layer from the piezoelectric donor substrate comprising applying an electric field. By applying an electric field, use is made of the piezoelectric properties of the donor substrate to weaken the predetermined splitting area, as the electric field will introduce a deformation within the piezoelectric donor substrate and further weaken the area of the defects in the predetermined splitting area due to building up complementary strain. As a consequence, the thermal budget necessary for the complete detachment of the piezoelectric layer to be detached can be lower.

According to certain embodiments, the piezoelectric donor substrate may comprise a single piezoelectric material, a so-called bulk piezoelectric substrate. According to other embodiments, the piezoelectric donor substrate may comprise a layer of piezoelectric material provided on a handle substrate. In the second case, a handle substrate may be chosen with a similar CTE with respect to the support substrate. A difference in CTE between handle and support substrate that is lower than 10%, with respect to the larger of the two CTE, allows a higher thermal budget for the thermal treatments assisting the above-described method compared to higher differences in the CTE and/or compared to the use of bulk piezoelectric substrates with a higher CTE difference with respect to the support substrate.

According to an embodiment, the method can further comprise an ion implantation step to form the predetermined splitting area and a thermal treatment step of the ion implanted piezoelectric donor substrate, wherein the thermal treatment step can be carried out in a temperature range of 0° C. to 200° C. for a duration between 1 hour and 24 hours. The thermal treatment step thereby may allow the defects in the predetermined splitting area to grow.

According to a preferred variant, step b) can comprise a heat treatment with a temperature of at most 100° C. or at most 50° C., or can even be carried out at room temperature between 15° C. and 25° C. in some embodiments. In a manufacturing process in which the detachment is achieved by a thermal treatment only, the bonding interface needs to be stabilized prior to the detachment step to prevent unwanted bonding defects at the moment of detachment. In the prior art, the enhancement of the bonding is obtained by heating the assembly prior to detachment. As already mentioned above, such a heat treatment leads to problems due to the difference in thermal expansion coefficient when using a piezoelectric donor substrate. By using an electric field during the detachment, the bonding energy between the donor substrate and the support substrate can be lower compared to the bonding energy necessary for a thermally induced detachment only. This is due to the fact that the impact of the mechanical distortion due to the presence of the electric field is very much limited to the piezoelectric donor substrate and has a lower impact on the interface with the support substrate.

According to a preferred variant, step b) can be carried out at a pressure below $10^{-2}$ mbar.

Preferably, step c) can be carried out at a temperature of less than 100° C., more in particular, less than 50° C., even more in particular, at room temperature between 15° C. and 25° C. Thus, the detachment can be obtained at a lower temperature compared to a detachment process that is not assisted by an electric field.

According to a preferred embodiment, the electric field can be applied using a chuck comprising at least one electrode. By using such a chuck, the electric field can be made available in a simple manner. The chuck may comprise holding means that are independent of such electrodes and being implemented by, for instance, vacuum or electrostatic properties.

Advantageously, the surface of the piezoelectric donor substrate of the assembly can be placed onto the chuck. In this arrangement, the process can be carried out independently of the electrical properties of the support substrate.

According to a variant, the chuck can comprise interdigitated electrodes separated by an electrical insulator, in particular, a ceramic material. In this configuration, it is possible to create a suitable electric field using only one electrode. This simplifies the design of the processing chamber.

According to an embodiment, the voltage applied to the chuck can be up to 10 kV, in particular, in a range between 1 kV and 5 kV. In this voltage range, a sufficiently strong electric field is formed in order to deform the piezoelectric donor substrate such that detachment can occur at a lower thermal budget.

According to a variant, the donor substrate-support substrate assembly can be sandwiched between the chuck and a second electrode, in particular, a second electrode in a second chuck. In a design using an electrode on both sides of the assembly, the voltage applied to the first and second electrodes can be lower than in the case of only one electrode.

Preferably, in this variant of the disclosure, the voltage applied to the electrostatic chuck can be up to 5 kV, in particular, in a range between 200 V and 1 kV.

According to an embodiment, the electrical field lines can be essentially parallel to the polarization direction of the piezoelectric material of the donor substrate. By aligning the electrical field to the polarization direction of the piezoelectric material of donor substrate, the amplitude of the resulting distortion can be enhanced and the detachment step facilitated.

Preferably, the piezoelectric donor substrate can be one of LiTaO$_3$ (LTO), AlN, ZnO, Pb[Zr$_x$Ti$_{1-x}$]O$_3$ (0≤x≤1) (PZT) and LiNbO$_3$ (LNO). Preferably, the support substrate can be a semiconductor substrate, in particular, a Si wafer, or an insulator, in particular, a sapphire wafer, or a metal, in particular, a Mo wafer.

Additional embodiments of the present disclosure include a detachment chamber for carrying out step c) as described above and that comprises one or two chucks for applying an electric field to a piezoelectric layer. The detachment chamber could, according to some embodiments, also be used for carrying out step b). The use of the chuck allows the creation of an electrical field that leads to a deformation in the piezoelectric substrate, thereby weakening the predetermined splitting area. As a consequence, the thermal budget necessary to perform the detachment of the piezoelectric layer from the remainder of the donor substrate can be lower compared to a process using only the thermal energy for the detachment step. Thus, the negative impact of a large difference in the thermal expansion coefficient between the donor substrate and the support substrate can be reduced.

Yet further embodiments of the disclosure include a chuck that comprises holding means for holding the assembly, in particular vacuum and/or electrostatic holding means and electrodes for applying an electric field for weakening a predetermined splitting area within the assembly. According to some embodiments, the electrostatic holding means and the electrodes for applying the electrical filed can be independent from each other. In this way, the holding action and the weakening action as described herein with respect to the method can be optimized with respect to each other.

BRIEF DESCRIPTION OF THE DRAWINGS

The disclosure will be described in more detail hereafter using advantageous exemplary embodiments in conjunction with the accompanying figures, wherein.

DETAILED DESCRIPTION

FIGS. 1a to 1e illustrate an embodiment of the method of transferring a piezoelectric layer onto a support substrate.

Figure 1A:
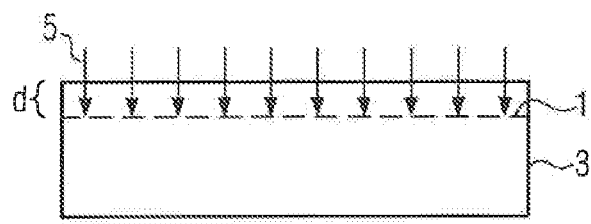
FIGS. 1a to 1e schematically illustrate an embodiment of a method of transferring a piezoelectric layer onto a support substrate.

In the process step illustrated in FIG. 1a, corresponding to step a) of the method according to the disclosure, a predetermined splitting area 1 is created in a piezoelectric donor substrate 3 by implanting ions 5.

The piezoelectric donor substrate 3 can comprise a material chosen from among, for example, LiTaO$_3$ (LTO), AlN, ZnO, Pb[Zr$_x$Ti$_{1-x}$]O$_3$ (0≤x≤1) (PZT) and LiNbO$_3$ (LNO). In the following, only as an example according to the disclosure, the piezoelectric donor substrate is a bulk piezoelectric substrate comprising LTO.

According to a variant, the donor substrate could comprise a handle substrate with a piezoelectric layer on top of the handle substrate.

To form the predetermined splitting area 1 within the piezoelectric donor substrate 3, a dose of $5*10^{16}$ to $2*10^{17}$ H$^+$ or He$^+$ or a mix of H$^+$/He$^+$ ions/cm$^2$ may be implanted with an energy of about 10 keV to 1 MeV as a function of the desired depth d of the predetermined splitting area 1. Under the implanting conditions mentioned above, the depth d of the predetermined splitting area 1 within the piezoelectric donor substrate 3 is of the order of 60 nm to 6 μm.

Figure 1B:
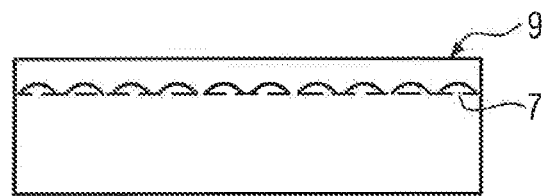

The next step, illustrated in FIG. 1b, is a rust thermal treatment step to grow defects 7 that form the predetermined splitting area 1 created by the ion implantation. The roughness of the surface 9 is below 5 nm RMS. According to the disclosure, this first thermal treatment step is carried out at temperatures between 0° C. and 200° C. for a duration of about 1 hour to 24 hours.

Figure 1C:
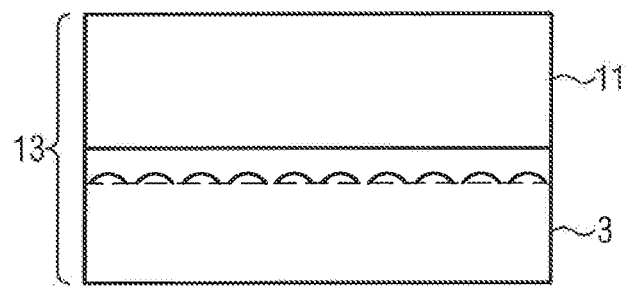

Step b), according to the disclosure, is illustrated in FIG. 1c. It comprises attaching, in particular by bonding, the piezoelectric donor substrate 3 to a support substrate 11 to thereby form an assembly 13. The support substrate 11 can be a semiconductor substrate, such as a Si wafer, or an insulator, such as sapphire, or a metal, such as Mo.

The bonding step is carried out at ambient pressure or under vacuum, typically a primary vacuum of below $10^{-2}$ mbar, in particular, of the order of $10^{-3}$ to $10^{-4}$ mbar. In order to strengthen the bond between the two substrates 3 and 11, the bonding process is carried out at a temperature of up to 100° C.

Figure 1D:
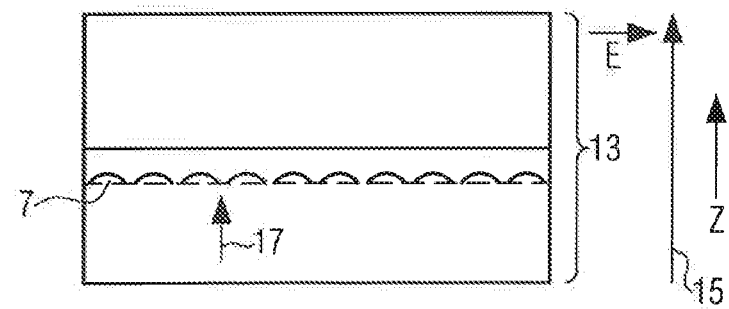

FIG. 1d illustrates the next step in the manufacturing process. This step corresponds to step c) according to the disclosure. An electric field is applied to the assembly 13, with the electric field lines 15 essentially perpendicular to the predetermined splitting area 1.

According to an aspect of the disclosure, the electric field lines 15 are essentially parallel to the polarization axis 17 (or poling axis) of the piezoelectric donor substrate 3 to optimize the piezoelectric effect. Due to the piezoelectric properties, the presence of the electric field lines 15 will lead to a mechanical deformation in the direction z inside the piezoelectric support substrate 11. This deformation further weakens the predetermined splitting area 1. To obtain the desired electric field, voltages of up to 10 kV are applied (see description below with respect to FIGS. 2 and 3).

Figure 1E:
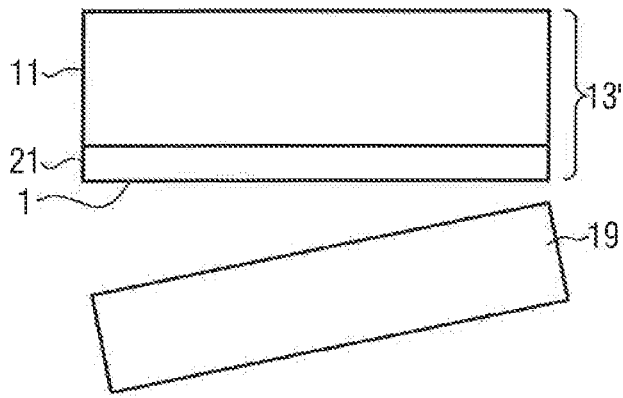

Depending on the strength of the electric field, a complete detachment of the remainder 19 of the piezoelectric donor substrate from the modified assembly 13' comprising the support substrate 11 and a transferred piezoelectric layer 21 can occur at the predetermined splitting area as illustrated in FIG. 1e.

According to a variant, the detachment as shown in FIG. 1e can also be obtained by heating the assembly 13 during or after the application of the electric field lines 15. In this second heat treatment step, temperatures of up to 100° C. are used for the final detachment. The choice of the temperature depends on the conditions of the first heat treatment step and the strength of the electric field lines 15.

With the method according to the disclosure, it becomes possible to transfer thin piezoelectric layers 21 onto a support substrate 11 without suffering from an existing large difference in the thermal expansion coefficient between the material of the piezoelectric layer 21 and the support substrate 11.

The remainder 19 of the piezoelectric donor substrate can then be reused as a piezoelectric donor substrate 3 to restart the process as described with respect to FIGS. 1a to 1e.

Figure 2:
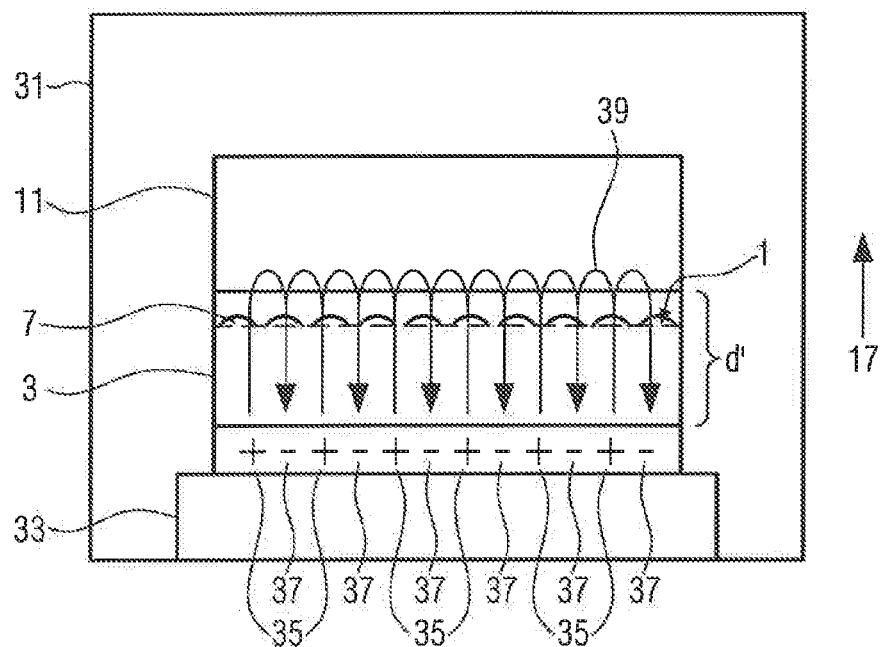
FIG. 2 schematically illustrates a setup according to a second embodiment of the disclosure.

FIG. 2 schematically illustrates a setup according to a second embodiment of the disclosure. FIG. 2 shows a detachment chamber 31 used to carry out at least step c) of the method according to the disclosure as illustrated in FIG. 1d.

The detachment chamber comprises a chuck 33 comprising positive electrodes 35 and negative electrodes 37 to be able to apply an electric field 39 to the assembly 13 comprising the piezoelectric donor substrate 3 and the support substrate 11 as described in detail with respect to the first embodiment. The description of the features of the first embodiment will not be repeated again, but is incorporated herewith by reference. The chuck may comprise further means for holding the assembly 13, e.g., a vacuum or a device configured to generate electrostatic forces. In this embodiment, those means for holding the assembly 13 are independent of the electrodes 35 and 37.

The assembly 13 is positioned on the chuck 33 such that the piezoelectric donor substrate 3 of the assembly 13 is placed onto the chuck 33.

The positive and negative electrodes 35, 37 are arranged such that the electric field 39 is essentially perpendicular to the surface of the chuck 33 at least within the thickness d' of the piezoelectric donor substrate 3. With the polarization axis 17 of the piezoelectric donor substrate also being perpendicular to the chuck 33, the piezoelectric effect can be optimized, thereby creating mechanical strain in the predetermined splitting area 1 further leading to weakening.

According to a variant, it could also be the support substrate that is positioned on the chuck 33, especially in the case when the electric field is sufficiently strong. However, for an insulating support substrate 11, it is preferable to position the piezoelectric donor substrate 3 on the chuck 33.

In one variant, the positive electrodes 35 and negative electrodes 37 are interdigitated with an electrically insulating material (not shown), e.g., a thin ceramic layer, positioned between the positive electrodes 35 and negative electrodes 37.

The control unit of the detachment chamber 31 is configured such that voltage differentials of up to 10 kV can be applied to the electrodes, preferably, 1 kV to 5 kV. In this embodiment, only one electrostatic chuck is necessary, which simplifies the design of the detachment chamber 31.

Figure 3:
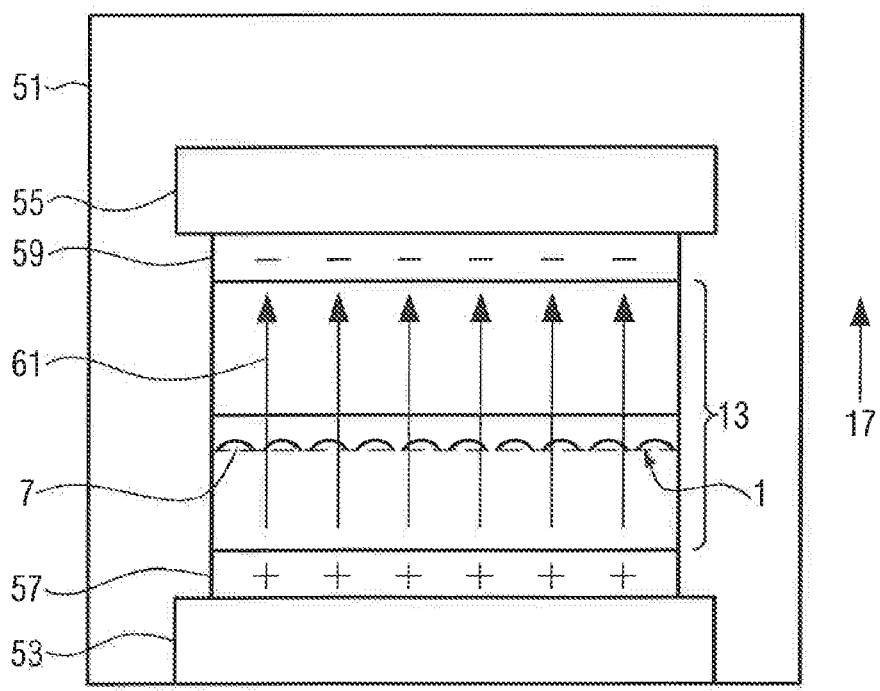
FIG. 3 schematically illustrates a setup according to a third embodiment of the disclosure.

FIG. 3 schematically illustrates a setup according to a third embodiment of the disclosure. FIG. 3 shows a second embodiment of a detachment chamber 51 used to carry out at least step c) of the method according to the disclosure as illustrated in FIG. 1d. The description of the features of the first and second embodiment will not be repeated again, but is incorporated herewith by reference.

In this embodiment, two chucks 53 and 55 are used. The lower chuck 53 comprises a positive electrode 57, the upper chuck 55 comprises a negative electrode 59. According to a variant, the polarization can be reversed. The assembly 13 is sandwiched between the two chucks 53, 55.

Also in this configuration, the electric field lines 61 are parallel to the polarization axis 17 of the piezoelectric donor substrate to optimize the piezoelectric effect leading to optimized weakening in the predetermined splitting area 1.

In this electrode configuration, voltages of up to 5 kV, especially 200 V to 1 kV, can be applied to the electrodes 57, 59 to obtain the desired effect in the predetermined splitting area 1 without observing a detachment at the interface between the piezoelectric donor substrate 3 and the support substrate 11.

The detachment chambers 31, 51 of the second and third embodiments may, according to further variants, be used for step b) of the method according to the disclosure, thus to realize the attachment step as illustrated in FIG. 1c. Furthermore it may, according to additional variants, also comprise heating means and/or a vacuum pump to be able to carry out the heat treatments and/or carry out the process steps under vacuum.

Features of any one of the first to third embodiments can be combined individually or in groups with any one of the other embodiments to form further variants of the method and/or splitting chamber according to the disclosure.

What is claimed is:

1. A detachment chamber for detaching a piezoelectric layer from a piezoelectric donor substrate, the detachment chamber comprising one or more chucks configured to apply an electric field through the piezoelectric donor substrate to detach the piezoelectric layer from the piezoelectric donor substrate, the one or more chucks comprising at least one positive electrode and at least one negative electrode configured to apply the electric field substantially parallel to a polarization direction of the piezoelectric donor substrate.

2. The detachment chamber of claim 1, wherein the one or more chucks comprises holding means for holding the piezoelectric donor substrate on the one or more chucks.

3. The detachment chamber of claim 2, wherein at least one of the at least one positive electrode and the at least one negative electrode is independent of the holding means.

4. The detachment chamber of claim 2, wherein the holding means comprises one or more of a vacuum holding means and an electrostatic holding means.

5. The detachment chamber of claim 1, further comprising heating means configured to heat the detachment chamber to a temperature of less than or equal to 100° C.

6. The detachment chamber of claim 1, further comprising a vacuum pump operatively in communication with the detachment chamber and configured to create a vacuum within the detachment chamber.

7. The detachment chamber of claim 1, wherein the one or more chucks comprises a first chuck and a second chuck, and wherein the at least one positive electrode is disposed in the first chuck and the at least one negative electrode is disposed in the second chuck.

8. The detachment chamber of claim 1, wherein the at least one positive electrode comprises positive electrodes and the at least one negative electrode comprises negative electrodes, the positive electrodes and negative electrodes being interdigitated and separated by an electrically insulating material.

9. A detachment chamber for detaching a piezoelectric layer from a piezoelectric donor substrate, the detachment chamber comprising:
    a first chuck comprising at least one positive electrode and a second chuck comprising at least one negative electrode, wherein the first chuck and the second chuck are spaced apart from each other with the at least one positive electrode of the first chuck facing the at least one negative electrode of the second chuck,
    wherein the at least one positive electrode and the at least one negative electrode are configured to apply an electric field through the piezoelectric donor substrate to detach the piezoelectric layer from the piezoelectric donor substrate, the electric field being substantially parallel to a polarization direction of the piezoelectric donor substrate.

10. The detachment chamber of claim 9, wherein the detachment chamber further comprises a heating means configured to heat the detachment chamber.

11. The detachment chamber of claim 9, wherein the detachment chamber further comprises electrostatic holding means for holding the piezoelectric donor substrate, the electrostatic holding means independent from the at least one positive electrode and the at least one negative electrode.

12. A method of forming a substrate comprising a support substrate and a piezoelectric layer, the method comprising:
    providing a chamber comprising at least one chuck, the at least one chuck comprising at least one positive electrode and at least one negative electrode, the at least one positive electrode and the at least one negative electrode configured to apply an electric field to the assembly;
    forming a predetermined splitting area in a piezoelectric donor substrate, the predetermined splitting area delimiting the piezoelectric layer to be transferred from the piezoelectric donor substrate;
    bonding the piezoelectric donor substrate to the support substrate to form an assembly, wherein the piezoelectric layer is adjacent to the support substrate; and
    applying the electric field to the assembly and through the piezoelectric donor substrate with the at least one electrode at a temperature of less than 100° C. to detach the piezoelectric layer from the piezoelectric donor layer and transfer the piezoelectric layer to the support substrate, the electric field being substantially parallel to a polarization direction of the piezoelectric donor substrate.

13. The method of claim 12, further comprising positioning the assembly on the chuck such that a polarization axis of the piezoelectric donor substrate is perpendicular to a main surface of the chuck.

14. The method of claim 12, wherein the chamber further comprises heating means configured to heat the chamber.

15. The method of claim 14, wherein bonding the piezoelectric donor substrate to the support substrate to form the assembly comprises applying a heat treatment to the assembly within the chamber at a temperature of less than or equal to 100° C.

16. The method of claim 14, wherein applying the electric field to the assembly comprises heating the chamber and the assembly to the temperature of less than 100° C. while applying the electric field to the assembly.

17. The method of claim 12, wherein:
    the chamber further comprises a vacuum pump operatively in communication with the chamber; and
    bonding the piezoelectric donor substrate to the support substrate to form the assembly is conducted within the chamber at a pressure below $10^{-2}$ mbar.

18. The method of claim 12, wherein:
    the at least one chuck comprises a first chuck comprising the at least one positive electrode and a second chuck comprising the at least one negative electrode; and
    applying the electric field to the assembly comprises applying a voltage of less than or equal to 5 kV to the at least one positive electrode and the at least one negative electrode, wherein the assembly is disposed between the at least one positive electrode of the first chuck and the at least one negative electrode of the second chuck.

19. The method of claim 12, wherein:
    the at least one chuck comprises a single chuck comprising the at least one positive electrode and the at least one negative electrode; and
    applying the electric field to the assembly comprises applying a voltage of less than or equal to 10 kV to the at least one positive electrode and the at least one negative electrode.

* * * * *